United States Patent
Park

[11] Patent Number: 5,904,516
[45] Date of Patent: May 18, 1999

[54] TRANSISTOR STRUCTURE AND METHOD FOR FABRICATING THE SAME

[75] Inventor: Sang Hoon Park, Bubaleub, Rep. of Korea

[73] Assignee: Hyundai Electronics Industries, Co., Ltd., Seoul, Rep. of Korea

[21] Appl. No.: 08/838,607

[22] Filed: Apr. 9, 1997

Related U.S. Application Data

[62] Division of application No. 08/665,048, Jun. 12, 1996, Pat. No. 5,661,327, which is a continuation of application No. 08/344,897, Nov. 25, 1994.

[30] Foreign Application Priority Data

Nov. 26, 1993 [KR] Rep. of Korea ............ 93-25366

[51] Int. Cl.⁶ ................................................ H01L 21/336
[52] U.S. Cl. .......................... 438/197; 438/300; 438/303
[58] Field of Search ................................... 438/231, 234, 438/303, 202, 197

[56] References Cited

U.S. PATENT DOCUMENTS

| | | |
|---|---|---|
| 4,463,491 | 8/1984 | Goldman et al. ............ 257/382 |
| 4,682,404 | 7/1987 | Miller et al. ............ 29/571 |
| 4,742,018 | 5/1988 | Kimura et al. ............ 437/48 |
| 4,766,473 | 8/1988 | Kuo ............ 357/23.5 |
| 4,804,636 | 2/1989 | Groover, III ............ 257/413 |
| 4,925,807 | 5/1990 | Yoshikawa ............ 257/408 |
| 4,971,922 | 11/1990 | Watabe et al. ............ 257/408 |
| 4,988,638 | 1/1991 | Huang et al. ............ 437/57 |
| 5,027,185 | 6/1991 | Liauh ............ 357/59 |
| 5,028,557 | 7/1991 | Tsai et al. ............ 437/59 |
| 5,079,617 | 1/1992 | Yoneda ............ 357/71 |
| 5,140,392 | 8/1992 | Ikemasu ............ 357/23.8 |
| 5,153,145 | 10/1992 | Lee et al. ............ 437/44 |
| 5,169,796 | 12/1992 | Murray et al. ............ 437/41 |
| 5,393,685 | 2/1995 | Yoo et al. ............ 437/44 |
| 5,399,895 | 3/1995 | Koga ............ 257/372 |
| 5,610,089 | 3/1997 | Iwai et al. ............ 437/34 |

*Primary Examiner*—John F. Niebling
*Assistant Examiner*—Christopher Lattin
*Attorney, Agent, or Firm*—Merchant, Gould, Smith, Edell, Welter & Schmidt, P.A.

[57] ABSTRACT

A transistor including an insulating file, a gate, and a source/drain all formed on a semiconductor substrate, wherein the gate overlaps at an edge thereof with the source/drain disposed below the gate, whereby the transistor has a structure capable of avoiding a direct contact between the metal wiring and the source/drain. The gate is formed after a formation of the source/drain.

6 Claims, 6 Drawing Sheets

5,904,516

TRANSISTOR STRUCTURE AND METHOD FOR FABRICATING THE SAME

This is a Divisional of application Ser. No. 08/665,048, filed Jun. 12, 1996, now U.S. Pat. No. 5,661,327 which is a continuation of Ser. No. 08/344,897, filed Nov. 25, 1994, which application(s) are incorporated herein by reference.

BACKGROUND OF THE INVENTION

1. Field of the Invention

The present invention relates to a transistor of a semiconductor device, and more particularly to a transistor structure capable of preventing a direct connection between a metal wiring and a source/drain and a method for fabricating the same.

2. Description of the Prior Art

Where a metal wiring comprised of, for example, an aluminum film is in contact with silicon, the aluminum is generally solved into the silicon. However, the solution of aluminum is non-uniformly generated. Actually, the solution of aluminum is generated at two or three particular points. In other words, a spiking phenomenon occurs that the aluminum penetrates the silicon in the form of a spike. Where a shallow junction is formed at the aluminum/silicon contact region, it may be short-circuited because the aluminum is diffused in the silicon due to the spiking phenomenon.

Referring to FIG. 1, there is illustrated a convention metal oxide semiconductor field effect transistor (MOSFET) and a method for fabricating the MOSFET.

As shown in FIG. 1, the MOSFET has a structure wherein a metal wiring is in contact with source and drain electrodes. For fabricating such a structure, a silicon substrate 1 is prepared which is defined with a P type well and an active region. A channel stop ion implantation region 9 is also defined in the silicon substrate 1. Thereafter, a field oxide film 2, a gate oxide film 3 and a doped polysilicon film 4 are sequentially formed. Thereafter, the resulting structure is subjected to a photolithography process to form a gate electrode. After the formation of gate electrode, source/drain electrodes 7 are forced. A contact hole is then formed. After the formation of contact hole, a metal wiring 8 is formed.

In the conventional MOSFET structure, however, the metal wiring is in direct contact with the silicon substrate such that it comes into contact with the impurity ion-implanted region because the source/drain electrodes are formed after the formation of gate electrode in accordance with the conventional method. As a result, a spiking phenomenon occurs. Due to such a spiking phenomenon, it is difficult to form a shallow junction.

SUMMARY OF THE INVENTION

Therefore, an object of the invention is to solve the above-mentioned problem encountered in the prior art and, thus, to provide a transistor structure capable of avoiding the spiking phenomenon occurring when a metal wiring is in direct contact with a source/drain electrode, thereby enabling a formation of a shallow junction, and a method for fabricating the transistor structure.

In accordance with one aspect, the present invention provides a transistor including an insulating film, a gate, and a source/drain all formed on a semiconductor substrate, wherein the gate overlaps at an edge thereof with the source/drain disposed below the gate.

In accordance with another aspect, the present invention provides a method for fabricating a transistor including an insulating film, a gate, and a source/drain all formed on a semiconductor substrate, the gate overlapping at an edge thereof with the source/drain disposed below the gate, wherein the gate is formed after a formation of the source/drain.

BRIEF DESCRIPTION OF THE DRAWINGS

Other objects and aspects of the invention will become apparent from the following description of embodiments with reference to the accompanying drawings in which.

DETAILED DESCRIPTION OF THE REFERRED EMBODIMENTS

Figure 1:
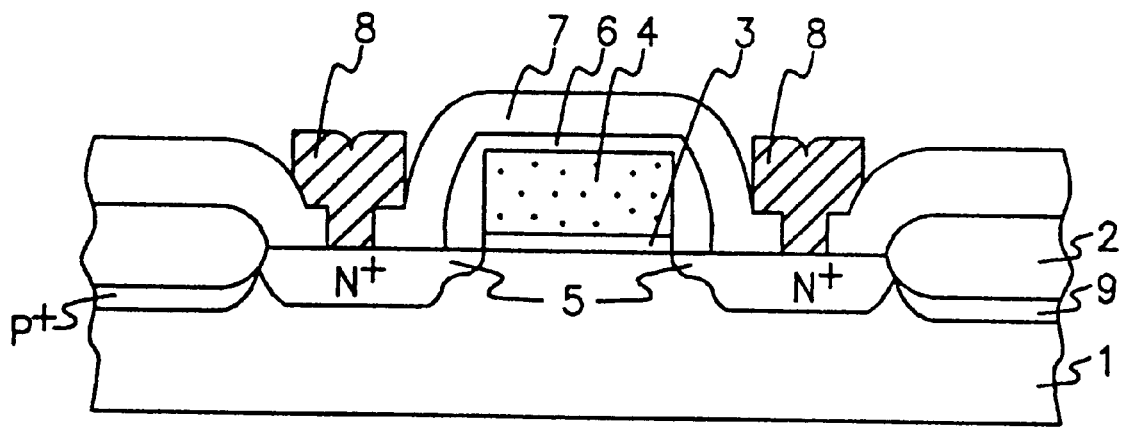
FIG. 1 is a sectional view illustrating a convention MOSFET structure and a method for fabricating the MOSFET structure.
Figure 2:
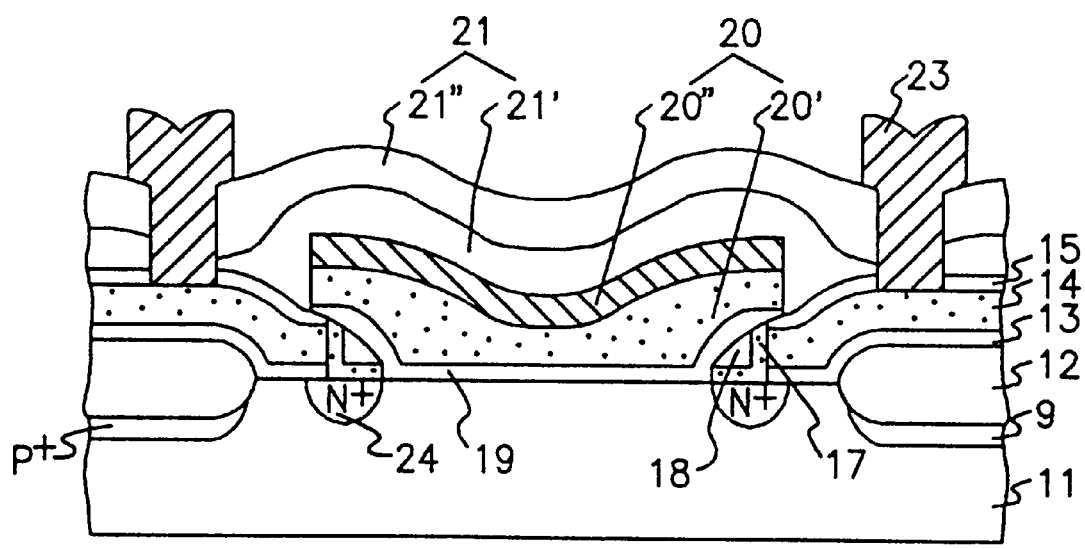
FIG. 2 is a sectional view illustrating a MOSFET structure in accordance with the present invention.

FIG. 2 is a sectional view illustrating a MOSFET structure in accordance with the present invention. As shown in FIG. 2, the MOSFET structure includes a gate electrode 20 formed on a semiconductor substrate 11 such that it overlaps with source/drain electrodes 24. Each of the source/drain electrodes 24 is in contact with a metal film 23 via a polysilicon film 14 disposed on a field oxide film 12 formed on the substrate 11. In FIG. 2, the reference numeral 9 denotes a channel stop ion implantation region, while the reference numerals 13 and 15 denote oxide films. The reference numeral 17 denotes a doped polysilicon film, 18 a photoresist film, 19 a gate oxide film, 21' an interlayer insulation film and 21" a BPSG (boro-phosphor-silicate-glass) film, respectively.

FIGS. 3A to 3E are sectional views respectively illustrating a method for fabricating the MOSFET shown in FIG. 2 in accordance with an embodiment of the present invention.

Figure 3A:
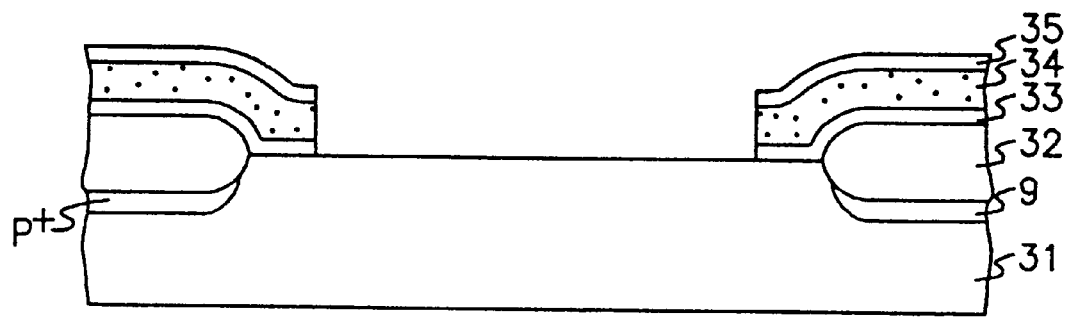
FIGS. 3A to 3E are sectional views respectively illustrating a method for fabricating the MOSFET shown in FIG. 2 in accordance with an embodiment of the present invention.

In accordance with this method, first, P type wells and an active region are defined in a silicon substrate 31 $P^+$ ions are implanted in the P type well, thereby forming channel stop ion implantation regions 9, as shown in FIG. 3A. Thereafter, a formation of a field oxide film 32 is carried out. Over the entire exposed surface of the resulting structure, an oxide film 33, a doped polysilicon film 34 and an oxide film 35 are sequentially formed such that they have predetermined thicknesses, respectively. The resulting structure is then subjected to a selective etch process so that the silicon substrate 31 is exposed at its surface portion disposed at the active region.

Figure 3B:
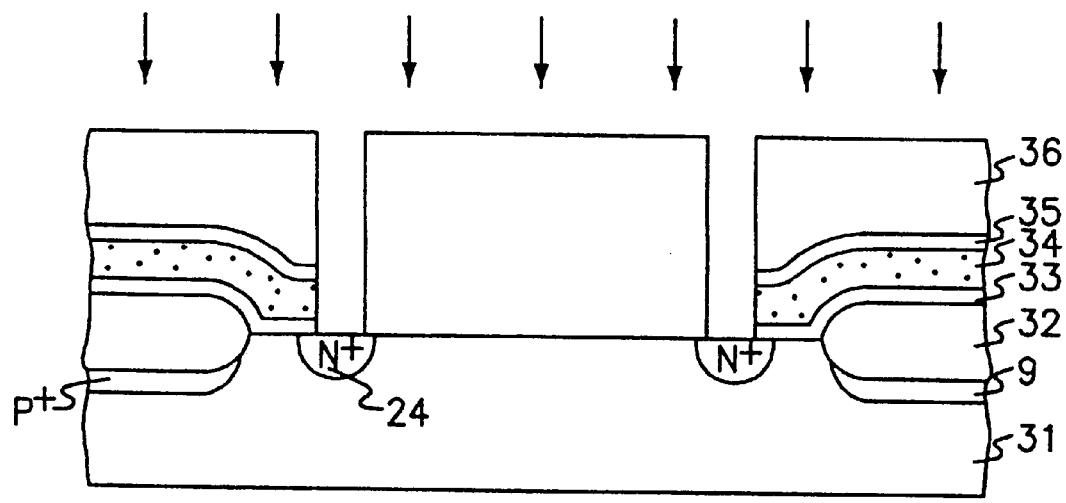

Subsequently, a photoresist film 36 is coated over the entire exposed surface of the resulting structure such that the structure has a planarized surface, as shown in FIG. 3B. The photoresist film 36 is then selectively etched so that the silicon substrate 31 is exposed at its portions respectively disposed at regions where source and drain electrodes are formed. $N^+$ impurity ions are then implanted in the exposed portions of silicon substrate 31, thereby forming source/drain electrodes 24.

Figure 3C:
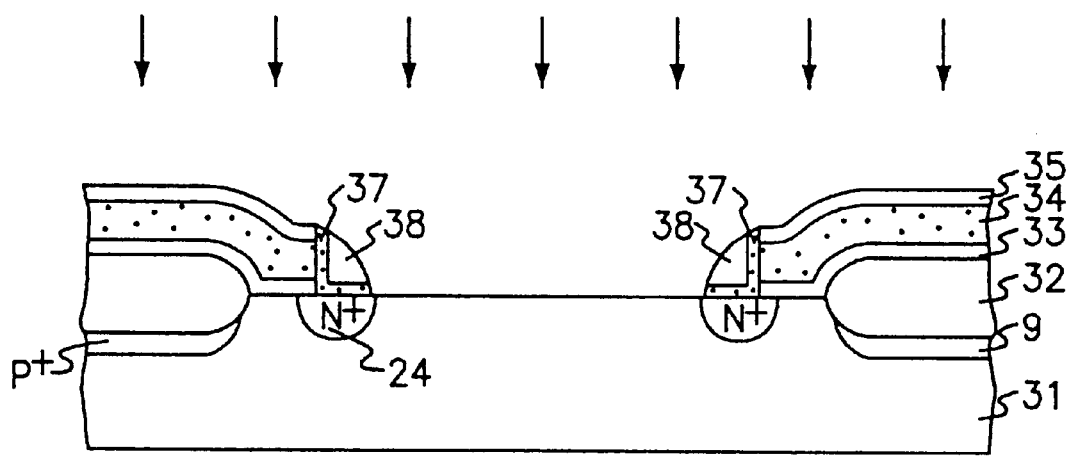

As shown in FIG. 3C, the remaining photoresist film 36 is then removed. Over the entire exposed surface of the resulting structure, a doped polysilicon film 37 having a thickness of 200 to 500 Å and a low temperature deposition oxide film 38 having a thickness of 1,500 to 2,500 Å are sequentially formed. Thereafter, the low temperature deposition oxide film 38 and the doped polysilicon film 37 are anisotropically etched such that only their portions disposed over the source/drain electrodes 24 remain. Impurity ions for control of a threshold voltage $V_T$ are implanted in the remaining films 37 and 38.

Figure 3D:
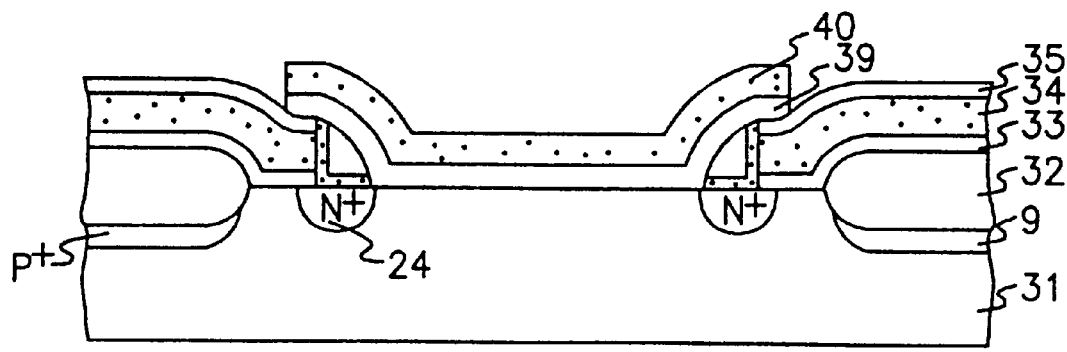

Subsequently, an oxide film and a doped polysilicon film are sequentially formed over the entire exposed surface of the resulting structure, as shown in FIG. 3D. The doped polysilicon film and the oxide film are selectively etched, thereby forming a gate oxide film 39 and a gate electrode 40. After the selective etch, the polysilicon film for the gate electrode overlaps with the oxide film 35.

Figure 3E:
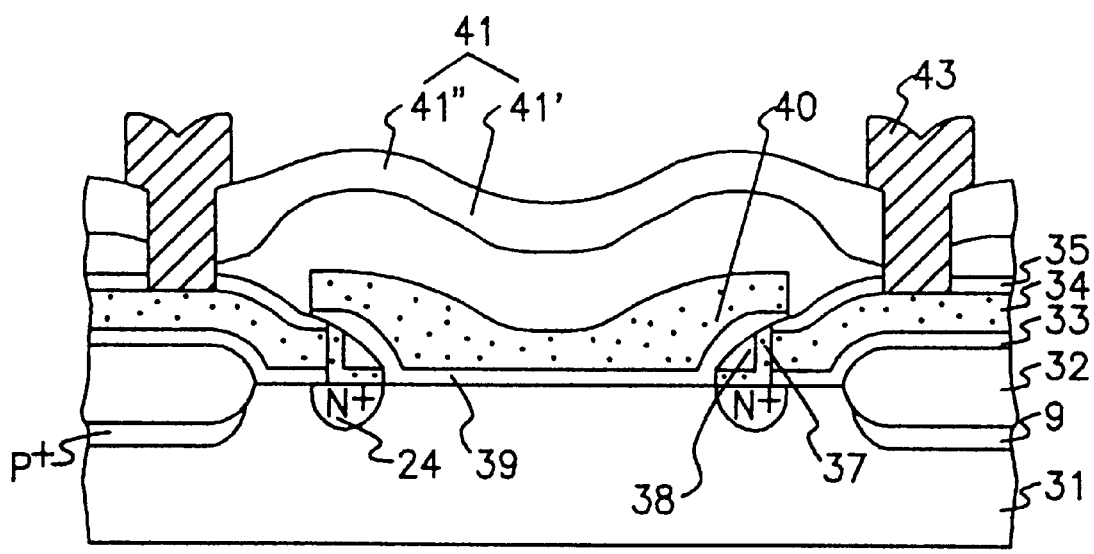

Over the entire exposed surface of the resulting structure, an interlayer insulating oxide film 41' and a boro-phosphor-silicate-glass (BPSG) film 41" are then formed, as shown in FIG. 3E. A formation of a contact hole is then carried out. Finally, an aluminum metal wiring 43 is formed such that it is in contact with the doped polysilicon film 24.

Figure 4A:
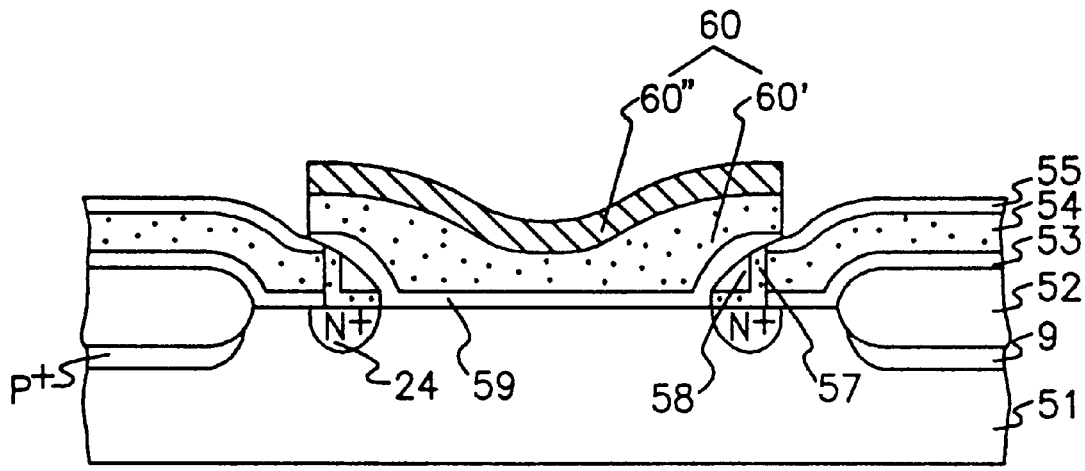
FIGS. 4A and 4B are sectional views respectively illustrating a method for fabricating the MOSFET shown in FIG. 2 in accordance with another embodiment of the present invention.
Figure 4B:
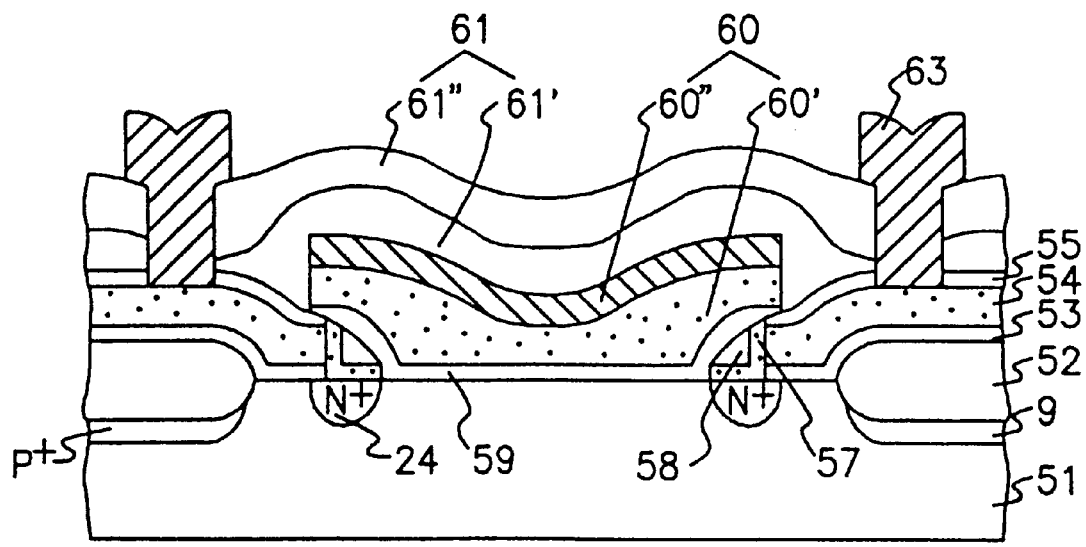

FIGS. 4A and 4B are sectional views respectively illustrating a method for fabricating the MOSFET shown in FIG. 2 in accordance with another embodiment of the present invention. This method includes the same steps as those shown in FIGS. 3A to 3C Accordingly, the following description is made only in conjunction with steps following the above-mentioned steps.

Over the entire exposed surface of the resulting structure obtained after performing the steps shown in FIGS. 3A to 3C, a gate oxide film 59, a doped polysilicon film 60' and a silicide film 60" are sequentially formed, as shown in FIG. 4A. Thereafter, the films 59, 60' and 60" are subjected to a selective etch process, thereby forming a gate electrode 60.

Subsequently, an interlayer insulating oxide film 61' and a BPSG film 61" are formed in a sequential manner over the entire exposed surface of the resulting structure, as shown in FIG. 4B. A formation of a contact hole is then carried out. Finally, an aluminum film is deposited over the entire exposed surface of the resulting structure including the contact hole, thereby formed a metal wiring 63.

As apparent from the above description, the present invention provides a transistor structure capable of avoiding a direct contact between a metal wiring and a source/drain electrode and thereby avoiding an occurrence of a spiking phenomenon, thereby enabling a formation of a shallow function. In the transistor structure of the present invention, the source/drain electrode overlaps with a gate electrode. As a result, it is possible to achieve an improved electrical characteristic and an improved reliability of a semiconductor device.

although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a transistor including an insulating film, a gate, and a source/drain all formed on a semiconductor substrate, the gate overlapping at an edge thereof with the source/drain disposed below the gate, the method comprising:

forming a field oxide film on the semiconductor substrate, sequentially forming an insulating film, a conduction film and another insulating film to predetermined thicknesses, and selectively etching the films such that the semiconductor substrate is exposed at a portion thereof disposed at a source/drain region;

implanting impurity ions in the exposed portion of the semiconductor substrate, thereby forming the source/drain;

forming a conduction film and an insulating film over the entire exposed surface obtained after the formation of the source/drain, and selectively etching the films, thereby forming a spacer disposed over the source/drain; and forming another insulating film and a polysilicon film over the entire exposed surface including said spacers and selectively etching the films, thereby forming a gate insulating film and the gate.

2. A method in accordance with claim 1, wherein the polysilicon film and the insulating film both constituting the gate are a doped polysilicon film and a silicide film, respectively.

3. A method in accordance with claim 1, wherein the conduction film constituting the spacer is a doped polysilicon film.

4. A method in accordance with claim 1, wherein the insulating film constituting the spacer is formed using a low temperature deposition process.

5. A method in accordance with claim 1, wherein the method comprises the steps of:

forming a planarizing insulating film over the entire exposed surface of the resulting structure obtained after the formation of the gate;

selectively etching the planarizing insulating film and the insulating film disposed over the conduction film being in contact with the spacer disposed over the source/drain, thereby exposing a predetermined portion of the conduction film being in direct contact with the source/drain; and forming a metal film on the exposed portion of the conduction film, thereby forming a metal wiring.

6. A method in accordance with claim 5, wherein the step of forming the planarizing insulating film comprises the steps of:

forming an oxide film over the entire exposed surface of the resulting structure obtained after the formation of the gate; and forming a boro-phosphor-silicate-glass film for a planarization over the oxide film.

* * * * *